United States Patent
Ohtsu et al.

(10) Patent No.: US 9,553,063 B2
(45) Date of Patent: Jan. 24, 2017

(54) SEMICONDUCTOR ELEMENT, SEMICONDUCTOR DEVICE AND METHOD FOR MANUFACTURING SEMICONDUCTOR ELEMENT

(75) Inventors: Kenji Ohtsu, Chiyoda-ku (JP); Yoshiji Ohtsu, legal representative, Aichi (JP); Taku Kusunoki, Chiyoda-ku (JP); Akira Yamada, Chiyoda-ku (JP); Takeharu Kuroiwa, Chiyoda-ku (JP); Masayoshi Tarutani, Chiyoda-ku (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 69 days.

(21) Appl. No.: 13/885,841

(22) PCT Filed: Apr. 18, 2011
(Under 37 CFR 1.47)

(86) PCT No.: PCT/JP2011/059511
§ 371 (c)(1),
(2), (4) Date: May 15, 2014

(87) PCT Pub. No.: WO2012/066803
PCT Pub. Date: May 24, 2012

(65) Prior Publication Data
US 2014/0312361 A1    Oct. 23, 2014

(30) Foreign Application Priority Data

Nov. 16, 2010    (JP) .................... 2010-255802

(51) Int. Cl.
*H01L 23/488*    (2006.01)
*H01L 23/00*    (2006.01)
(Continued)

(52) U.S. Cl.
CPC .......... *H01L 24/13* (2013.01); *H01L 23/4827* (2013.01); *H01L 24/03* (2013.01); *H01L 24/05* (2013.01);
(Continued)

(58) Field of Classification Search
None
See application file for complete search history.

(56) References Cited

U.S. PATENT DOCUMENTS 5,449,955 A * 9/1995 Debiec et al. ................ 257/751
2002/0086520 A1* 7/2002 Chiang ........................ 438/630
(Continued)

FOREIGN PATENT DOCUMENTS

CN    101159251 A    4/2008
CN    101266957 A    9/2008
(Continued)

OTHER PUBLICATIONS

Office Action issued on Jan. 27, 2014 in the counterpart Korean Patent Application No. 10-2013-7012433 (with English Translation).
(Continued)

*Primary Examiner* — Fei Fei Yeung Lopez
(74) *Attorney, Agent, or Firm* — Oblon, McClelland, Maier & Neustadt, L.L.P.

(57) ABSTRACT

The semiconductor element has an electrode including: a Ni-inclusion metal layer containing nickel formed on a side of at least one surface of the semiconductor-element constituting part; a Ni-barrier metal layer formed outwardly on a side of the Ni-inclusion metal layer opposite to the side toward the semiconductor-element constituting part; and a surface metal layer outwardly formed on a side of the Ni-barrier metal layer opposite to the side toward the semiconductor-element constituting part, to be connected to (Continued)

(a)

(b)

the metal nanoparticles sintered layer; wherein the Ni-barrier metal layer contains a metal for suppressing diffusion of nickel toward the surface metal layer.

11 Claims, 3 Drawing Sheets

(51) Int. Cl.
*H01L 29/45* (2006.01)
*H01L 23/482* (2006.01)
*H01L 21/04* (2006.01)
*H01L 29/16* (2006.01)

(52) U.S. Cl.
CPC .............. *H01L 24/29* (2013.01); *H01L 24/83* (2013.01); *H01L 29/45* (2013.01); *H01L 29/452* (2013.01); H01L 21/0485 (2013.01); H01L 29/1608 (2013.01); H01L 2224/04026 (2013.01); H01L 2224/0517 (2013.01); H01L 2224/0518 (2013.01); H01L 2224/05147 (2013.01); H01L 2224/05155 (2013.01); H01L 2224/05166 (2013.01); H01L 2224/05171 (2013.01); H01L 2224/05179 (2013.01); H01L 2224/05181 (2013.01); H01L 2224/05639 (2013.01); H01L 2224/05644 (2013.01); H01L 2224/05647 (2013.01); H01L 2224/05669 (2013.01); H01L 2224/05678 (2013.01); H01L 2224/29006 (2013.01); H01L 2224/2908 (2013.01); H01L 2224/29339 (2013.01); H01L 2224/32013 (2013.01); H01L 2224/32245 (2013.01); H01L 2224/8384 (2013.01); H01L 2224/83192 (2013.01); H01L 2224/83203 (2013.01); H01L 2224/83439 (2013.01); H01L 2924/0104 (2013.01); H01L 2924/01006 (2013.01); H01L 2924/01024 (2013.01); H01L 2924/01029 (2013.01); H01L 2924/01041 (2013.01); H01L 2924/01042 (2013.01); H01L 2924/01047 (2013.01); H01L 2924/01073 (2013.01); H01L 2924/01077 (2013.01); H01L 2924/01078 (2013.01); H01L 2924/01079 (2013.01); H01L 2924/1033 (2013.01); H01L 2924/10253 (2013.01); H01L 2924/10254 (2013.01); H01L 2924/10272 (2013.01); H01L 2924/12032 (2013.01); H01L 2924/1305 (2013.01); H01L 2924/13091 (2013.01); H01L 2924/15747 (2013.01)

(56) References Cited

U.S. PATENT DOCUMENTS

| 2003/0002239 A1* | 1/2003 | Schmidt et al. ........... 361/321.2 |
| 2003/0034485 A1 | 2/2003 | Uchida et al. |
| 2003/0082860 A1* | 5/2003 | Yoshida ............ H01L 21/28575 438/184 |
| 2004/0245648 A1* | 12/2004 | Nagasawa ............. B22F 1/0022 257/772 |
| 2005/0040524 A1* | 2/2005 | Pu et al. ........... H01L 23/49816 257/734 |
| 2005/0127134 A1* | 6/2005 | Lu et al. ....................... 228/101 |
| 2006/0160330 A1 | 7/2006 | Kobayashi et al. |
| 2006/0273323 A1* | 12/2006 | Yamamoto et al. ............ 257/77 |
| 2008/0217770 A1* | 9/2008 | Fukuda ........................ 257/737 |
| 2008/0265386 A1 | 10/2008 | Muto et al. |
| 2010/0105174 A1 | 4/2010 | Muto et al. |
| 2012/0034742 A1 | 2/2012 | Muto et al. |

FOREIGN PATENT DOCUMENTS

| JP | 2003-59860 A | 2/2003 |
| JP | 2006-344688 A | 12/2006 |
| JP | 2008-294384 A | 12/2008 |
| JP | 2008-311371 A | 12/2008 |
| JP | 2009-49144 A | 3/2009 |

OTHER PUBLICATIONS

International Search Report issued Jun. 28, 2011, in PCT/JP2011/059511.
Philip W. Lees, "Interdiffusion Between Connector Contact Materials and Nickel Diffusion Barriers During Precipitation Hardening of High Performance Spring Materials", IEEE, 1994, pp. 189-194.
Ahmed M. Abdul-Lettif, "Investigation of interdiffusion in copper-nickel bilayer thin films", Science Direct Physica B, 388, 2007, pp. 107-111.
Office Action issued Dec. 17, 2013 in Japanese Patent Application No. 2012-544119 (with English language translation).
Combined Office Action and Search Report issued on Oct. 27, 2015 in Chinese Patent Application No. 201180054833.0 with English translation.
Office Action issued Apr. 29, 2016 in Chinese Patent Application No. 201180054833.0 (with English language translation).
German Office Action issued Aug. 26, 2016, in corresponding Patent Application No. 11 2011 103 782.1.
Chinese Office Action issued Oct. 10. 2016, in corresponding Patent Application No. 201180054833.0.

* cited by examiner (a)

(b)

| Retained time at the high temperature [h] | | Adhesion strength | | | | | |
|---|---|---|---|---|---|---|---|
| | | 0 | 200 | 400 | 600 | 800 | 1000 |
| Comparative sample | Sample 1-1 | ○ | × | × | × | × | × |
| | Sample 1-2 | ○ | ○ | × | × | × | × |
| | Sample 1-3 | ○ | × | × | × | × | × |
| Example | Sample 2-1 | ○ | ○ | ○ | ○ | ○ | ○ |
| | Sample 2-2 | ○ | ○ | ○ | ○ | ○ | ○ |
| | Sample 2-3 | ○ | ○ | ○ | ○ | ○ | ○ |

○: 30kgf/chip or more
×: less than 30kgf/chip

Retained at the high temperature (250°C, 1000h)

(a)  (b)

Retained at the high temperature (250°C, 200h)

(a)  (b)

SEMICONDUCTOR ELEMENT, SEMICONDUCTOR DEVICE AND METHOD FOR MANUFACTURING SEMICONDUCTOR ELEMENT

CROSS REFERENCE TO RELATED APPLICATIONS

The present application is a 35 U.S.C. §371 national stage patent application of International patent application PCT/JP2011/059511, filed on Apr. 18, 2011, published as WO/2012/066803 on May 24, 2012, the text of which is incorporated by reference, and claims the benefit of the filing date of Japanese application no. 2010-255802, filed on Nov. 16, 2010, the text of which is also incorporated by reference.

TECHNICAL FIELD

This invention relates to an electrode structure of a semiconductor element operable at a high temperature.

BACKGROUND ART

Semiconductor elements operable at a high temperature (high-temperature operation compatible semiconductor elements) are, in some cases other than when packaged as stand-alone elements, put into operation as mounted on mounting boards. There are proposed many electrode structures on back faces of semiconductor elements for joining the high-temperature operable semiconductor elements and the mounting boards together, in order to make the high-temperature operable semiconductor elements and the mounting boards to be stably joined for a long period of time. Meanwhile, when semiconductor elements operable at a normal range temperature are joined to the mounting boards, in order to make a solder Pb(lead)-free or to realize a low-temperature joining, they are in some cases joined by using an Sn (tin)-base solder, a metal-nanoparticles paste and the like. Also for the high-temperature operable semiconductor elements, there are proposed many electrode structures on the back faces of the semiconductor elements for joining the high-temperature operable semiconductor elements and the mounting boards by using an Sn-base solder, a metal-nanoparticles paste and the like.

An Sn-base solder is mainly used for low-temperature joining of a semiconductor element, and is promising as a Pb-free solder. A metal-nanoparticles paste contains metal nanoparticles as main components, and can be lowered in its melting point or sintering temperature to several hundreds degree C. or less.

In Patent Document 1, a structure of a back face electrode of semiconductor element is described, in which a Ni (nickel) silicide layer, a Ti (titanium) layer (first metal layer), a Ni (nickel)) layer (second metal layer) and an Au (gold) layer (third metal layer) are sequentially stacked on a semiconductor substrate consisting mainly of Si(silicon). Patent Document 1 is a document related to a semiconductor substrate for preventing a nickel silicide layer (ohmic electrode) on a back face of a semiconductor element from peeling off, and a method for manufacturing the semiconductor substrate. The structure of the back face electrode in Patent Document 1 is characterized in that, it is achieved by lowering a temperature for forming the Ni silicide layer to from 100 to 300° C. after sequentially stacked a first Ni layer, the Ti layer, the second Ni layer and the Au layer on the semiconductor substrate consisting mainly of silicon, so that a Ni layer portion remains in the Ni silicide layer at a side thereof opposite to the side toward the substrate, and a stress applicable to the stacked metal layers on the remaining Ni layer is reduced, to thereby enhance its adhesion to the substrate.

CITATION LIST

Patent Document

Patent Document 1: Japanese Patent Application Laid-open No. 2009-49144 (FIG. 4)

SUMMARY OF THE INVENTION

Problems to be Solved by the Invention

However, when a semiconductor element having the electrode structure described above is joined to a mounting board using a metal nanoparticles paste, Ni in the Ni layer (second metal layer) and Au in the Au layer (third metal layer) interdiffuse due to a high-temperature operation after the element is mounted on the mounting board, so that a layered nickel that is non-adhesive to a metal nanoparticles sintered layer, emerges on the uppermost surface of the Au layer that is the surface layer of the electrode. Accordingly, it is difficult to achieve a sufficient joint strength with good repeatability between the electrode of the semiconductor element and the metal nanoparticles sintered layer. The invention has been made to solve the problem as described above, and an object thereof is to provide a semiconductor element having an electrode which makes the semiconductor element and the metal nanoparticles sintered layer to be stably adhered together for a sufficiently long period of time, even when the semiconductor element operates at a high temperature, in particular, at 175° C. or more.

Means for Solving the Problems

A semiconductor element according to the invent-ion has an electrode comprising: a Ni-inclusion metal layer containing nickel formed on a side of at least one surface of a semiconductor-element constituting part; a Ni-barrier metal layer formed outwardly on a side of the Ni-inclusion metal layer opposite to the side toward the semiconductor-element constituting part; and a surface metal layer formed outwardly on a side of the Ni-barrier metal layer opposite to the side toward the semiconductor-element constituting part, to be connected to the metal nanoparticles sintered layer; wherein the Ni-barrier metal layer contains a metal serving to suppress diffusion of the nickel toward the surface metal layer.

Effect of the Invention

According to this invention, since the Ni-barrier metal layer containing a metal serving to suppress diffusion of nickel, is inserted in the electrode of the semiconductor element, it becomes possible to achieve a stable adhesion strength for a long period of time between the semiconductor element and the metal nanoparticles sintered layer under operation of the semiconductor element at a high temperature after mounted on the mounting board.

MODES FOR CARRYING OUT THE INVENTION

Embodiment 1

Figure 1:
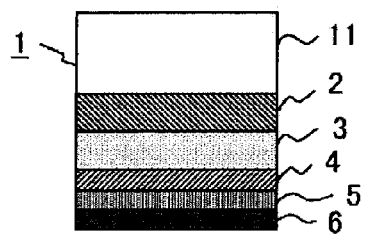
FIG. 1 is a cross-sectional schematic diagram showing an electrode of a semiconductor element according to Embodiment 1 of the invention.
Figure 2:
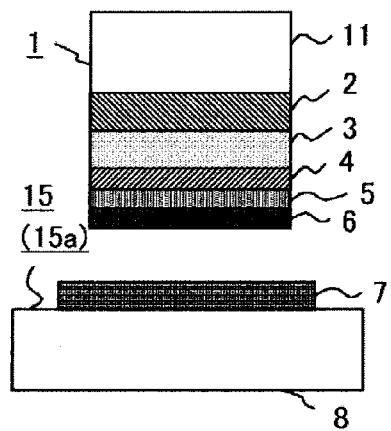
FIG. 2 is a diagram illustrating a method for manufacturing a semiconductor device according to Embodiment 1 of the invention.
Figure 2:
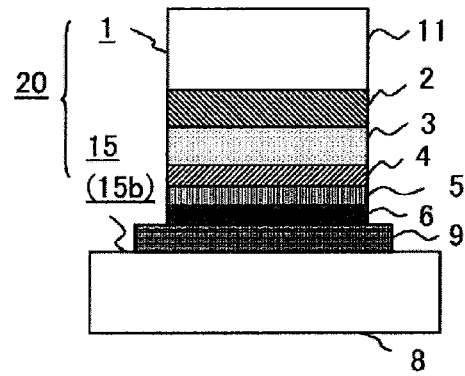

FIG. 1 is a cross-sectional schematic diagram showing an electrode of a semiconductor element according to Embodiment 1 of the invention, and FIG. 2 is a diagram illustrating a method for manufacturing a semiconductor device according to Embodiment 1 of the invention. A semiconductor element 1 is, for example, a power semiconductor element, such as a schottky diode, a MOS (Metal Oxide Semiconductor) transistor, a bipolar transistor etc. The invention is applicable to a semiconductor element in which an electrode of a multi-layer structure containing a metal silicide is formed on an electrode-forming portion of the semiconductor. In the semiconductor element 1, a metal silicide layer 2, a first metal layer 3, a second metal layer 4, a third metal layer 5 and a fourth metal layer 6 are sequentially formed on one surface of a semiconductor substrate 11. It is noted that in the semiconductor substrate 11, a semiconductor-element constituting part of the semiconductor element 1, that is, a structure of a schottky diode, a MOS transistor, a bipolar transistor etc., other than the electrode, has been formed before the formation of the electrode. In this figure, the semiconductor-element constituting part of the semiconductor element 1 is omitted from illustration.

In this Embodiment 1, a silicon carbide substrate is used as the semiconductor substrate 11. As the silicon carbide substrate, a publicly known one is usable, which is not necessary to be specifically limited. On one face of the silicon carbide substrate, that is, on its one face having an electrode-forming portion, the metal layers, such as a titanium (Ti) layer, a nickel (Ni) layer, a copper (Cu) layer and a gold (Au) layer are formed as the first metal layer 3, the second metal layer 4, the third metal layer 5 and the fourth metal layer 6, respectively, by a publicly known method such as a sputtering method or the like. The thickness of each metal layer thus formed is, although not specifically limited and may thus be adjusted as appropriate according to the size of the semiconductor element 1 to be fabricated, generally 10 nm or more and 2000 nm or less.

When investigating or studying a property of the electrode of the semiconductor element in order to develop an electrode of the semiconductor element, such a product is useful in which the metal silicide layer 2, the first metal layer 3, the second metal layer 4, the third metal layer 5 and the fourth metal layer 6 are sequentially formed on a semiconductor substrate having no operable semiconductor element formed therein. Hereinafter, description of the semiconductor element 1 will be made by citing a case of using a product in which an electrode structure is formed on the substrate 11 having no operable semiconductor element formed therein.

Here is described a method for preparing an electrode of the semiconductor element 1. On one surface of the silicon carbide substrate 11, a metal layer for forming the metal silicide layer 2 is formed in a predetermined thickness, for example, a thickness of 50 nm, followed by heat treating in the condition required for the metal silicide layer under vacuum atmosphere, to thereby form the metal silicide layer 2 having approximately the predetermined thickness (approx. 50 nm, for example) [Metal Silicide Layer Forming Step].

Using a sputtering method or the like, on the surface of the metal silicide layer 2, the first metal layer (adhesion metal layer) 3 which is to be an adhesion layer tightly adhering to the metal silicide layer 2 is formed [First Metal Layer Forming Step, or Adhesion Metal Layer Forming Step]. On a face side of the first metal layer 3 opposite to the face side toward the substrate, the second metal layer containing nickel (Ni-inclusion metal layer) 4 is formed using a sputtering method or the like [Second Metal layer Forming Step, or Ni-inclusion Metal layer Forming Step]. On a face side of the second metal layer 4 opposite to the face side toward the substrate, the third metal layer containing copper (Ni-barrier metal layer) 5 is formed using a sputtering method or the like [Third Metal layer Forming Step, or Ni-barrier Metal Layer Forming Step]. On a face side of the third metal layer 5 opposite to the face side toward the substrate, the fourth metal layer 6 containing a noble metal, which is a surface metal layer, is formed using a sputtering method or the like [Fourth Metal layer Forming Step, or Surface Metal Layer Forming Step].

As a metal for forming the first metal layer 3, one of the metals of Ti, Chromium (Cr), tantalum (Ta), niobium (Nb), molybdenum (Mo) and zirconium (Zr), or an alloy containing at least one of Ti, Cr, Ta, Nb, Mo and Zr, may be used. As for the second metal layer 4, a metal of nickel or an alloy containing nickel may be used. As for the third metal layer 5, a metal of copper or an alloy containing copper may be used. As for the fourth metal layer 6, one of the metals of Au, platinum (Pt), Ag, iridium (Ir) and Cu, or an alloy containing at least one of Au, Pt, Ag, Ir and Cu, may be used.

Using FIG. 2, a method for manufacturing a semiconductor device according to Embodiment 1 of the invention will be described. Shown at FIG. 2(a) is a diagram of the semiconductor element and a mounting board before joining together, and at FIG. 2 (b) is a diagram of the semiconductor device after joining them. The mounting board 15 for mounting the semiconductor element 1 is prepared as follows. On a surface of a base plate 8, a metal nanoparticles paste layer 7 is formed by printing or the like using a stainless mask having an opening of a given size, to thereby prepare a mounting board 15 (15a). On the metal nanoparticles paste layer 7, the semiconductor element 1 is placed to prepare a semiconductor device before joining them. Using a joining device, the thus-prepared semiconductor device before joining is retained, while being pressed at a given pressure, at a predetermined temperature for a predetermined time, so that metal nanoparticles contained in the metal nanoparticles paste layer 7 are sintered together to convert the metal nanoparticles paste layer 7 to a metal nanoparticles sintered layer 9. Thereafter, it is subjected to air cooling, so that the semiconductor device 20 is achieved in which the semiconductor element 1 is joined and tightly adhered to the mounting board 15(15b) having the metal nanoparticles sintered layer 9.

As a metal nanoparticles paste forming the metal nanoparticles paste layer 7, an Ag-nanoparticles paste or a Cu-nanoparticles paste may be used.

Figures 3, 4:
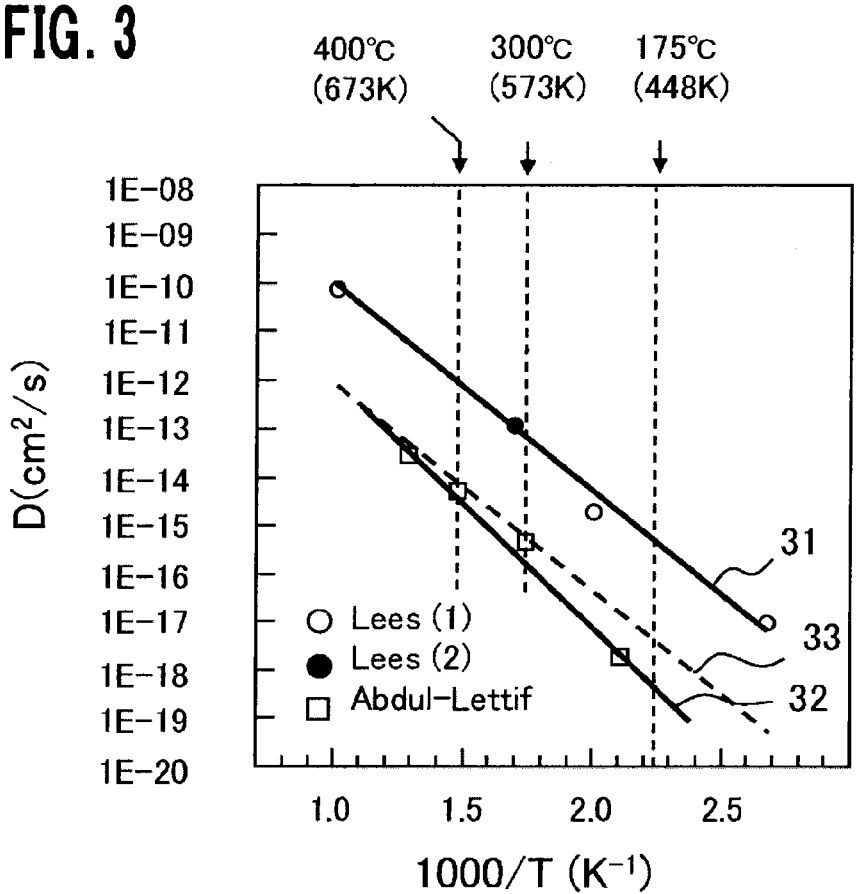
FIG. 3 is a graph showing Arrhenius plots of diffusion coefficient of nickel.
FIG. 4 is a table showing as a list the results in an example of the invention and a comparative example.

The third metal layer 5 is able to suppress diffusion of nickel in the second metal layer 4 toward the fourth metal layer 6, and thus serves as a Ni-barrier metal layer. Here is explained that copper (Cu) in the third metal layer 5 acts as a Ni-barrier metal. FIG. 3 is a graph showing Arrhenius plots of diffusion coefficient of nickel, where diffusion coefficient D ($cm^2$/sec) is represented on the ordinate and inverse number of the absolute temperature (1000/T ($K^{-1}$)) is represented on the abscissa. A characteristic line 31 represents a character of the diffusion coefficient when Ni and Au interdiffuse, and a characteristic line 32 represents a character of the diffusion coefficient when Ni diffuses into a metal of copper. The data of the characteristic line 31 is based on a FIG. 3 (hereinafter, FIG.A) described in P. W. Lees et. al "INTERDIFFUSION BETWEEN CONNECTOR CONTACT MATERIALS AND NICKEL DIFFUSION BARRIERS DURING PRECIPITATION HARDENING OF HIGH PERFORMANCE SPRING MATERIALS", proceedings of the Fortieth IEEE Holm Conference on Electrical Contacts (1994)189 (Literature 1). The data of the characteristic line 32 is based on a FIG. 3 (hereinafter, FIG.B) described in A. M. Abdul-Lettif "Investigation of interdiffusion in copper-nickel bilayer thin films", Science Direct Physica B388 (2007)107 (Literature 2). The data shown in FIG. 3 by white circles correspond to those shown in FIG.A of Literature 1 as black triangles (Lees-Grain Boundary (Plated)), and the data shown in FIG. 3 by a black circle corresponds to that shown in FIG.A of Literature 1 as x-mark. The data shown in FIG. 3 as white squares corresponds to those shown in FIG.B of Literature 2 as black diamonds. A reference line 33 corresponds to the characteristic line 31 shifted in the direction of the ordinate axis by one-hundredth scale.

Diffusion coefficients D at about 300° C. (573K) shown in the above Literatures 1 and 2 will be described. Literature 1 shows that the diffusion coefficient when Ni and Au interdiffuse at 315 (588K) is approximately $1\times10^{-13}$. On the other hand, Literature 2 shows that the diffusion coefficient when Ni diffuses into a metal of copper at 300° C. (573K) is $4.3\times10^{-16}$. At about 300° C. (573K), the diffusion coefficient when Ni diffuses into a metal of copper is approx. one-hundredth times the diffusion coefficient when Ni and Au interdiffuse. That is, the diffusion of Ni into Cu is slower than and approx. one-hundredth times the diffusion of Ni into Au. Thus, an insertion of a copper layer in the electrode structure of the high-temperature operable semiconductor element, makes the copper layer serve to prevent Ni from diffusing into a gold layer (one-type of the fourth metal layer 6) that is placed outside (surface side of the semiconductor element) of the copper layer, thereby making it possible not to cause interdiffusion between the gold layer and the nickel layer during practical accumulated-time of operation. According to the structure of the semiconductor-element electrode in which the copper layer is inserted between the gold layer and the nickel layer, it is possible not to form a layered nickel that is non-adhesive to a metal nanoparticles sintered layer 9, on the uppermost surface of the gold layer, so that a stable adhesion strength is maintained for a long period of time between the gold layer and the metal nanoparticles sintered layer 9.

As an element for constituting the fourth metal layer 6 that is in contact with the metal nanoparticles paste layer 7 and formed at the uppermost surface of the electrode, Pt, Ag, Ir and Cu are also usable other than Au. Even when the element for constituting the fourth metal layer 6 is Pt, Ag, Ir or Cu, an insertion of a copper layer in the structure of the semiconductor-element electrode, makes the copper layer serve to prevent Ni from diffusing into the fourth metal layer 6 that is placed outside of the copper layer. Thus, by inserting the copper layer 5 between the fourth metal layer 6 and the nickel layer 4, it is possible not to form a layered nickel that is non-adhesive to the metal nanoparticles sintered layer 9, on the uppermost surface of the fourth metal layer 6, so that a stable adhesion strength is maintained for a long period of time between the fourth metal layer 6 and the metal nanoparticles sintered layer 9.

In FIG. 3, over the whole temperature range that the characteristic line 31 is drawn in, the diffusion coefficient D of the characteristic line 32 is almost the same as, or less than that of the reference line 33. Thus, over the whole temperature range that the characteristic line 31 is drawn in, the diffusion of Ni into Cu is slower than and approx. one-hundredth times the diffusion of Ni into Au. Since the semiconductor element formed in the silicon carbide substrate is operable at 175° C. (448K) or more, by inserting the copper layer between the gold layer and the nickel layer of the electrode structure, it becomes possible to maintain a stable adhesion strength for a long period of time between the gold layer and the metal nanoparticles sintered layer 9 in a operable temperature range of the semiconductor element formed in the silicon carbide substrate. Likewise, when the fourth metal layer 6 contains Pt, Ag, Ir and/or Cu, it is possible to maintain a stable adhesion strength for a long period of time between the fourth metal layer 6 and the metal nanoparticles sintered layer 9.

In the foregoing, the description is made for the case where the second metal layer (Ni-inclusion metal layer) 4 is formed on a surface of the first metal layer (adhesion metal layer) 3, and then the third metal layer (Ni-barrier metal layer) 5 and the fourth metal layer (surface metal layer) 6 are sequentially formed; however, it suffices that the third metal layer (Ni-barrier metal layer) 5 is formed outwardly on a side of the second metal layer (Ni-inclusion metal layer) 4 opposite to the side toward the semiconductor-element constituting part. Also, it suffices that the fourth metal layer (surface metal layer) 6 is formed outwardly on a side of the third metal layer (Ni-barrier metal layer) 5 opposite to the side toward the semiconductor-element constituting part. Even with such electrode structures, by including in the electrode of the semiconductor element 1, the Ni-barrier metal layer 5 containing a metal suppressing diffusion of nickel, it becomes possible not to form a layered nickel that is non-adhesive to the metal nanoparticles sintered layer 9, on the uppermost surface of the fourth metal layer 6, so that a stable adhesion strength is achieved for a long period of time between the semiconductor element 1 and the metal nanoparticles sintered layer 9 under a high-temperature operation of the semiconductor element 1 after mounting it on the mounting board 15.

According to the semiconductor element of Embodiment 1, it includes an electrode which comprises: the Ni-inclusion metal layer 4 containing nickel formed on a side of at least one surface of the semiconductor-element constituting part; the Ni-barrier metal layer 5 formed outwardly on a side of the Ni-inclusion metal layer 4 opposite to the side toward the semiconductor-element constituting part; and the surface metal layer 6 formed outwardly on a side of the Ni-barrier metal layer 5 opposite to the side toward the semiconductor-element constituting part, which is to be connected to the metal nanoparticles sintered layer 9; wherein the Ni-barrier metal layer 5 contains a metal serving to suppress diffusion of the nickel toward the surface metal layer 6. Thus, by virtue of inclusion, in the electrode of the semiconductor element 1, of the Ni-barrier metal layer that contains a metal serving to suppress diffusion of the nickel, it becomes possible to achieve a stable adhesion strength for a long period of time between the semiconductor element 1 and the metal nanoparticles sintered layer under a high-temperature operation after mounting the semiconductor element 1 on the mounting board 15.

According to the semiconductor device of Embodiment 1, it includes the mounting board 15 and the semiconductor element 1 mounted on the mounting board 15 through the metal nanoparticles sintered layer 9, said semiconductor element 1 including an electrode which comprises: the Ni-inclusion metal layer 4 containing nickel formed on a side of at least one surface of the semiconductor-element constituting part of the semiconductor element 1; the Ni-barrier metal layer 5 formed outwardly on a side of the Ni-inclusion metal layer 4 opposite to the side toward the semiconductor-element constituting part; and the surface metal layer 6 formed outwardly on a side of the Ni-barrier metal layer 5 opposite to the side toward the semiconductor-element constituting part, which is to be connected to the metal nanoparticles sintered layer 9; wherein the Ni-barrier metal layer 5 contains a metal serving to suppress diffusion of the nickel toward the surface metal layer 6. Thus, by virtue of inclusion, in the electrode of the semiconductor element, of the Ni-barrier metal layer that contains the metal serving to suppress diffusion of the nickel, the semiconductor device in which the semiconductor element is mounted on the mounting board, can achieve a stable adhesion strength for a long period of time between the semiconductor element and the metal nanoparticles sintered layer.

According to the method for manufacturing a semiconductor element of Embodiment 1, it comprises: a Ni-inclusion metal layer forming step of forming the Ni-inclusion metal layer containing nickel on a side of at least one surface of a semiconductor-element constituting part of the semiconductor element 1; a Ni-barrier metal layer forming step of forming the Ni-barrier metal layer 5 outwardly on a side of the Ni-inclusion metal layer 4 opposite to the side toward the semiconductor-element constituting part; and a surface metal layer forming step of forming the surface metal layer 6 outwardly on a side of the Ni-barrier metal layer 5 opposite to the side toward the semiconductor-element constituting part, which is to be connected to the metal nanoparticles sintered layer 9; wherein the Ni-barrier metal layer 5 contains a metal serving to suppress diffusion of the nickel toward the surface metal layer 6. Thus, by virtue of inclusion, in the electrode of the semiconductor element 1, of the Ni-barrier metal layer that contains the metal serving to suppress diffusion of the nickel, it becomes possible to achieve a stable adhesion strength for a long period of time between the semiconductor element 1 and the metal nanoparticles sintered layer 9 under a high-temperature operation of the semiconductor element 1 after mounting it on the mounting board 15.

Meanwhile, as a material for the high-temperature operation compatible semiconductor element, a gallium nitride-family material or diamond is usable other than silicon carbide (SiC). For example, when silicon carbide (SiC), a gallium nitride-family material or diamond is used for the semiconductor element 1 serving as a switching element or a rectifying element, its power loss is lower than that of a conventionally used element made of silicon (Si), so that it is possible to enhance an efficiency of the high-temperature operation compatible semiconductor element, such as power semiconductor device, etc. Further, since its breakdown voltage is high and its allowable current value is also high, the semiconductor device can be made compact. Furthermore, a wide bandgap semiconductor element has a higher heat resistance, allowing its high temperature operation, and making it possible to downsize a heat dissipation fin of a heat sink as well as to replace a water-cooling part with an air-cooling part, so that the semiconductor device can be made more compact.

EXAMPLES

Hereinafter, details of the invention will be described by an example; however, the invention is not limited by the example.

Example 1

As a simulated semiconductor element 1, a silicon carbide substrate having a thickness of 500 μm was prepared. Note that a silicon carbide substrate provided with a circuit pattern formed therein may be used instead. As a metal layer for forming the metal silicide layer 2, a nickel layer having a thickness of 50 nm was formed by a sputtering method, and thereafter, it was subjected to heat treatment at 800° C. under vacuum atmosphere for 1 hour, so that the nickel silicide layer having a thickness of approx. 50 nm could be formed. By sputtering methods, a titanium (Ti) layer having a thickness of 200 nm was formed as the first metal layer 3 on the surface of the metal silicide layer 2; a nickel (Ni) layer having a thickness of 200 nm was formed as the second metal layer 4 on the surface of the titanium layer; a copper (Cu) layer having a thickness of 200 nm was formed as the third metal layer 5 on the surface of the nickel layer; and a gold (Au) layer having a thickness of 200 nm was formed as the fourth metal layer 6 on the surface of the copper layer, sequentially. Thereafter, it was divided by cutting in a dicing step into 5.0 mm□ (5.0 mm square, □ denotes square), and then used after washing as the semiconductor element 1.

Next, the mounting board 15 for mounting the semiconductor element 1 was prepared. First, the base plate 8 was a copper (Cu) plate having an area of 10 mm and a thickness of 1.0 mm on a surface of which a silver (Ag) plating (5 μm thick) was prepared. On the surface of the base plate 8, an Ag-nanoparticles paste is printed as the metal nanoparticle paste layer 7 using a stainless mask with an opening size of 6 mm □and a thickness of 0.2 mm, followed by placing the semiconductor element 1 on the surface of the Ag-nanoparticles paste layer 7, to obtain the semiconductor device before joining. As the Ag-nanoparticles paste, T2W-A2 manufactured by DOWA Corporation is usable. As the joining device, a thermal compression bonding unit (AP-100M) manufactured by Athlete FA corporation was used. After subjected to a pre-heat treatment for 10 minutes at 100° C., the above-obtained semiconductor device before joining was heated up to 350° C. while being pressed at 5 MPa, and was kept for 5 minutes after the temperature reaching 350° C., so that Ag-nanoparticles contained in the Ag-nanoparticles paste were sintered together to form the Ag-nanoparticles sintered layer 9. Thereafter, it was air-cooled to achieve the semiconductor device 20. Three samples of the semiconductor devices 20 were fabricated.

The thus constituted semiconductor devices 20 were retained at a high temperature of 250° C. for 1000 hours, and each adhesion strength for every 200 hours was measured by a shear-measuring device named die-shear tester (HS4000) manufactured by Dage corporation. In order to judge the adhesion strength, a strength of 30 kgf/chip or more was determined to be no adhesion abnormality, and that of less than 30 kgf/chip was determined to be reduction in strength.

The results are shown in FIG. 4. FIG. 4 is a table showing as a list the results in an example of the invention and a comparative example. The description about the comparative example will be made later. As seen from FIG. 4, the samples of this example each having the copper (Cu) layer inserted therein (Samples 2-1, 2-2, 2-3) do not show any reduction in adhesion strength even after 1000 hours.

Figure 5:
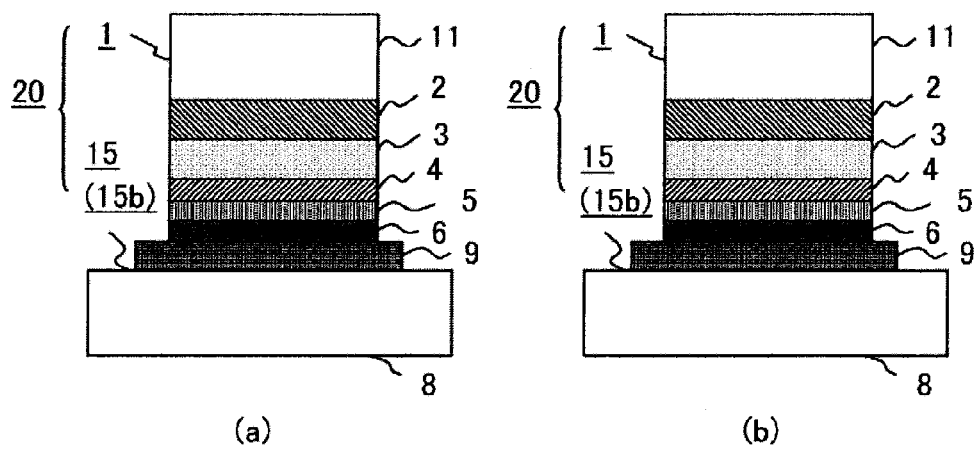
FIG. 5 is a diagram illustrating a structure of the electrode after the semiconductor device according to Embodiment 1 of the invention was retained at 250° C.

For each sample (Samples 2-1, 2-2, 2-3) after 1000 hours, its semiconductor-element electrode was subjected to an element analysis using a wavelength dispersive X-ray spectroscopy. Diffusion of Ni in the nickel layer 4 into the gold layer 6 was prevented due to the insertion of the copper layer 5. Thus, according to the semiconductor device 20 of Example 1, there was no structural change in the electrode as shown in FIG. 5 even after retained at 250° C. for 1000 hours. FIG. 5 is a diagram illustrating a structure of the electrode after the semiconductor device according to Embodiment 1 of the invention was retained at 250° C., in which the semiconductor device 20 before retained at the high temperature is shown at FIG. 5(a), and the semiconductor device 20 after retained at the high temperature is shown at FIG. 5(b).

Comparative Example 1

Comparative samples for comparing with the samples of Example 1 were fabricated by the following method. A nickel silicide layer (metal silicide layer 2) having a thickness of approx. 50 nm was formed on one surface of the silicon carbide substrate 11 having a thickness of 500 μm by the same method as in Example 1. By sputtering methods, a titanium (Ti) layer having a thickness of 200 nm was formed as the first metal layer 3 on the surface of the metal silicide layer 2; a nickel (Ni) layer having a thickness of 200 nm was formed as the second metal layer 4 on the surface of the titanium layer; and a gold (Au) layer having a thickness of 200 nm was formed as the surface metal layer 6 on the surface of the nickel layer, sequentially. Thereafter, it was divided by cutting in a dicing step into a size of 5.0 mm □, and then used after washing as the semiconductor element 35 (35a, see FIG. 6). For manufacturing a semiconductor device, the same method as in Example 1 was applied. Three samples of the semiconductor devices 40 (40a, see FIG. 6) in which the semiconductor element 35 is mounted on the mounting board 15(15b), were fabricated.

Figure 6:
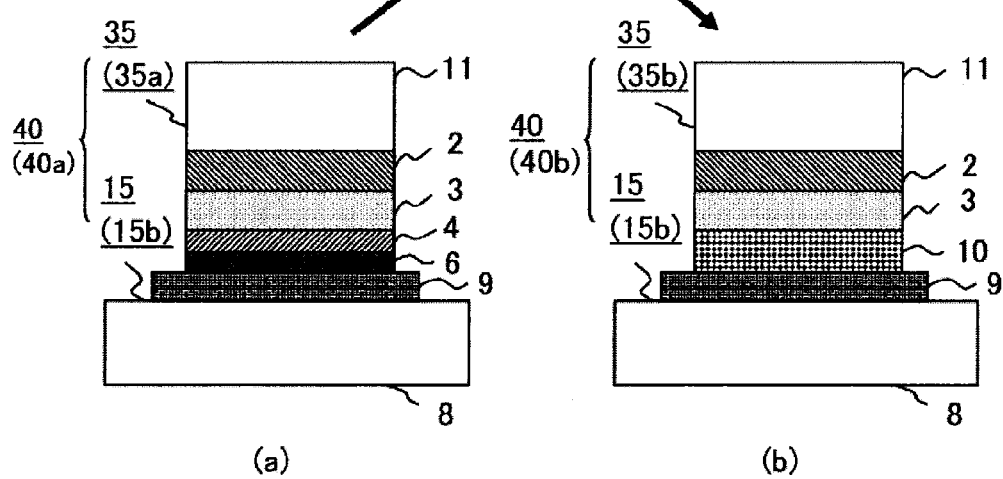
FIG. 6 is a diagram illustrating a structure of the electrode after a semiconductor device according to a comparative example was retained at 250° C.

Similarly to Example 1, the thus constituted semiconductor devices 40(40a) were retained at a high temperature of 250° C. for 1000 hours, and each adhesion strength for every 200 hours was measured by a shear-measuring device named die-shear tester (HS4000) manufactured by Dage corporation. As seen in FIG. 4 and differently from Example 1, some of the samples of Comparative Example 1 in which the copper layer 5 is not inserted, show reduction in adhesion strength at the time of 200 hours (Samples 1-1, 1-3). FIG. 6 is a diagram illustrating a structure of the electrode after the semiconductor device according to Comparative Example 1 was retained at 250° C., in which the semiconductor device 40(40a) before retained at the high temperature is shown at FIG. 6(a), and the semiconductor device 40(40b) after retained at the high temperature is shown at FIG. 6(b).

For each sample (Samples 1-1, 1-3) after 200 hours, its semiconductor-element electrode was subjected to an element analysis using a wavelength dispersive X-ray spectroscopy. By the element analysis of the element electrode that showed reduction in adhesion strength after 200 hours, a nickel element has been detected, differently from Example 1, at an uppermost surface portion of the gold layer, which was resulted from interdiffusion of Ni in the nickel layer 4 and Au in the gold layer 6. Thus, according to the semiconductor device 40b of Comparative Example 1, there was a structural change in the electrode as shown in FIG. 6, after retained at 250° C. for 200 hours. That is, Ni in the nickel layer (the second metal layer) 4 and Au in the gold layer (the surface metal layer) 6 of the semiconductor device 40a before retained at the high temperature, caused interdiffusion, so that a diffusion layer (interdiffusion layer) 10 has been formed by the metal (Ni) of the second metal layer and the metal (Au) of the surface metal layer. Thus, in the semiconductor device 40b after retained at the high temperature, its electrode structure was a layered structure comprising the metal silicide layer 2, the first metal layer 3 and the interdiffusion layer 10.

DESCRIPTION OF REFERENCE NUMERALS AND SIGNS

1: semiconductor element, 2: metal silicide layer, 3: first metal layer (adhesion metal layer), 4: second metal layer (Ni-inclusion metal layer), 5: third metal layer (Ni-barrier metal layer), 6: fourth metal layer (surface metal layer), 9: metal nanoparticles sintered layer, 15: mounting board, 20: semiconductor device.

The invention claimed is:
1. A semiconductor device, comprising a mounting board and a semiconductor element,
   wherein the semiconductor element is mounted on the mounting board through a metal nanoparticles sintered layer,
   wherein the metal nanoparticles sintered layer comprises at least one of Ag-nanoparticles or Cu-nanoparticles, and
   wherein the semiconductor element comprises an electrode,
   wherein the electrode comprises:
   a Ni-inclusion metal layer comprising nickel disposed on a side of at least one surface of a semiconductor-element constituting part of the semiconductor element;
   a Ni-barrier metal layer disposed outwardly on a side of the Ni-inclusion metal layer opposite to the side toward the semiconductor-element constituting part;
   a surface metal layer disposed outwardly on a side of the Ni-barrier metal layer opposite to the side toward the semiconductor-element constituting part;
   a metal silicide layer disposed on the at least one surface of the semiconductor-element constituting part; and
   an adhesion metal layer disposed on a surface of the metal silicide layer on a side opposite to the side toward the semiconductor-element constituting part,
   wherein the Ni-barrier metal layer comprises at least one of metallic copper or a copper alloy which suppresses diffusion of the nickel toward the surface metal layer, and
   wherein the Ni-inclusion metal layer is disposed on a surface of the adhesion metal layer on a side opposite to the side toward the semiconductor-element constituting part, and
   wherein the Ni-barrier metal layer comprises a copper alloy.
2. The semiconductor device of claim 1, wherein the metal nanoparticles sintered layer comprises Ag-nanoparticles.

3. The semiconductor device of claim 1, wherein the metal nanoparticles sintered layer comprises Cu-nanoparticles.

4. The semiconductor device of claim 1, wherein the surface metal layer comprises a noble metal.

5. The semiconductor device of claim 4, wherein the surface metal layer comprises at least one metal selected from the group consisting of gold, platinum, silver, iridium and copper.

6. The semiconductor device of claim 1, wherein the adhesion metal layer comprises at least one element selected from the group consisting of titanium, chromium, tantalum, niobium, molybdenum and zirconium.

7. The semiconductor device of claim 1, wherein the semiconductor-element constituting part comprises a wide bandgap semiconductor material.

8. The semiconductor device of claim 7, wherein the wide bandgap semiconductor material is selected from the group consisting of a silicon carbide, a gallium nitride family material and diamond.

9. The semiconductor device of claim 1, wherein the surface metal layer is suitable for connecting to the metal nanoparticles sintered layer.

10. A method of manufacturing the semiconductor device of claim 1, comprising mounting the semiconductor element on the mounting board through the metal nanoparticles sintered layer.

11. The method of claim 10, wherein the semiconductor element is manufactured by a method comprising:
    forming a metal silicide layer disposed on the at least one surface of the semiconductor-element constituting part;
    forming an adhesion metal layer disposed on a surface of the metal silicide layer on a side opposite to the side toward the semiconductor-element constituting part;
    forming a Ni-inclusion metal layer comprising nickel on a side of at least one surface of a semiconductor-element constituting part of the semiconductor element;
    forming a Ni-barrier metal layer outwardly on a side of the Ni-inclusion metal layer opposite to the side toward the semiconductor-element constituting part; and
    forming a surface metal layer outwardly on a side of the Ni-barrier metal layer opposite to the side toward the semiconductor-element constituting part.

* * * * *